(12) United States Patent
Zhang et al.

(10) Patent No.: US 11,051,393 B2
(45) Date of Patent: *Jun. 29, 2021

(54) MOBILE TERMINAL AND HEAT DISSIPATION AND SHIELDING STRUCTURE

(71) Applicant: HUAWEI TECHNOLOGIES CO., LTD., Guangdong (CN)

(72) Inventors: Zhiguo Zhang, Wuhan (CN); Yingchun Zhang, Shenzhen (CN); Haitao Zhen, Wuhan (CN); Nanbo Kang, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/807,522

(22) Filed: Mar. 3, 2020

(65) Prior Publication Data
US 2020/0205278 A1    Jun. 25, 2020

Related U.S. Application Data (63) Continuation of application No. 15/578,992, filed as application No. PCT/CN2015/080737 on Jun. 4, 2015, now Pat. No. 10,602,603.

(51) Int. Cl.
*H05K 1/02* (2006.01)
*H05K 5/02* (2006.01)
(Continued)

(52) U.S. Cl.
CPC ......... *H05K 1/0203* (2013.01); *H05K 5/0086* (2013.01); *H05K 5/02* (2013.01); *H05K 9/0024* (2013.01); *H05K 7/2039* (2013.01)

(58) Field of Classification Search
CPC ...... H05K 9/0024; H05K 1/0203; H05K 5/02; H05K 7/2039; H05K 9/0025–0035; H05K 7/20509
(Continued)

(56) References Cited

U.S. PATENT DOCUMENTS 6,624,432 B1 * 9/2003 Gabower ............. H04B 1/3838
174/384
6,829,146 B2    12/2004 Franz et al.
(Continued)

FOREIGN PATENT DOCUMENTS

CN        201557361 U    8/2010
CN        202026562 U    11/2011
(Continued)

*Primary Examiner* — Zachary Pape (57) ABSTRACT

A mobile terminal includes a circuit board, a heat emitting element disposed on the circuit board, a shielding can, and a middle frame, where the shielding can is connected to the circuit board, and forms a shielding space together with the circuit board; the heat emitting element is accommodated in the shielding space; the circuit board is disposed on one side of the middle frame; the middle frame is provided with an accommodating space; and the shielding can includes a top and a bottom that are disposed opposite to each other, where the bottom is configured to be connected to the circuit board, and the top is located above the heat emitting element and extends to the accommodating space. The present disclosure further provides a heat dissipation and shielding structure. The present disclosure helps make a mobile terminal and a heat dissipation and shielding structure lighter and thinner.

20 Claims, 3 Drawing Sheets

(51) Int. Cl.
  *H05K 9/00* (2006.01)
  *H05K 5/00* (2006.01)
  *H05K 7/20* (2006.01)

(58) Field of Classification Search
  USPC .................................... 361/800, 816, 818
  See application file for complete search history.

(56) References Cited

U.S. PATENT DOCUMENTS

| | | | |
|---|---|---|---|
| 9,224,672 B1 | 12/2015 | Pykäri et al. | |
| 10,602,603 B2 * | 3/2020 | Zhang | H05K 1/0203 |
| 2003/0092305 A1 | 5/2003 | Takeuchi | |
| 2004/0217472 A1 | 11/2004 | Aisenbrey et al. | |
| 2004/0244397 A1 | 12/2004 | Kim | |
| 2007/0210082 A1 | 9/2007 | English et al. | |
| 2010/0144410 A1 | 6/2010 | Ishihara | |
| 2010/0309631 A1 | 12/2010 | Hill et al. | |
| 2011/0255250 A1 | 10/2011 | Dinh et al. | |
| 2012/0147573 A1 | 6/2012 | Lim et al. | |
| 2012/0243195 A1 | 9/2012 | Lim et al. | |
| 2012/0281360 A1 | 11/2012 | Nicol et al. | |
| 2013/0016477 A1 | 1/2013 | Yokoya et al. | |
| 2013/0077282 A1 | 3/2013 | Malek et al. | |
| 2014/0009891 A1 | 1/2014 | Chen et al. | |
| 2014/0321058 A1 | 10/2014 | Fujieda et al. | |
| 2015/0131225 A1 * | 5/2015 | Chang | H04M 1/0202 |
| | | | 361/679.54 |
| 2015/0155614 A1 | 6/2015 | Youn et al. | |
| 2015/0201533 A1 | 7/2015 | Daughtry, Jr. et al. | |
| 2015/0282387 A1 | 10/2015 | Yoo et al. | |
| 2015/0282392 A1 | 10/2015 | Liu et al. | |
| 2015/0305210 A1 | 10/2015 | Yu et al. | |
| 2016/0088769 A1 | 3/2016 | Hsiao | |
| 2016/0109911 A1 | 4/2016 | Han | |
| 2016/0135282 A1 | 5/2016 | Hata | |
| 2016/0135331 A1 | 5/2016 | Wu | |
| 2016/0135336 A1 | 5/2016 | Wu | |
| 2016/0212251 A1 | 7/2016 | Oh | |
| 2016/0242331 A1 | 8/2016 | Park et al. | |
| 2017/0006738 A1 | 1/2017 | Lee et al. | |
| 2017/0033442 A1 | 2/2017 | Choi et al. | |
| 2017/0075396 A1 | 3/2017 | Damaraju et al. | |
| 2017/0150657 A1 | 5/2017 | Seo et al. | |
| 2017/0155746 A1 | 6/2017 | Yang et al. | |
| 2017/0181264 A1 | 6/2017 | Brey | |
| 2017/0238410 A1 | 8/2017 | Li et al. | |
| 2017/0262018 A1 | 9/2017 | Kim et al. | |
| 2017/0367175 A1 | 12/2017 | Lai | |
| 2018/0035528 A1 | 2/2018 | Kim et al. | |
| 2018/0049351 A1 | 2/2018 | Yu et al. | |
| 2018/0084636 A1 | 3/2018 | Pakula et al. | |
| 2018/0157093 A1 | 6/2018 | Jang et al. | |

FOREIGN PATENT DOCUMENTS

| | | |
|---|---|---|
| CN | 102548365 A | 7/2012 |
| CN | 102695365 A | 9/2012 |
| CN | 202496170 U | 10/2012 |
| CN | 202635004 U | 12/2012 |
| CN | 202713891 U | 1/2013 |
| CN | 103052285 A | 4/2013 |
| CN | 203136420 U | 8/2013 |
| CN | 103943610 A | 7/2014 |
| CN | 204191058 U | 3/2015 |
| EP | 1553814 A1 | 7/2005 |
| EP | 2464206 A2 | 6/2012 |
| FR | 2951048 A1 | 4/2011 |
| JP | 2000216582 A | 8/2000 |
| JP | 2001320192 A | 11/2001 |
| JP | 2002368481 A | 12/2002 |
| JP | 2006269680 A | 10/2006 |
| JP | 2006319134 A | 11/2006 |
| JP | 2007067279 A | 3/2007 |
| JP | 2008028342 A | 2/2008 |
| JP | 2008219662 A | 9/2008 |
| JP | 2008263347 A | 10/2008 |
| JP | 2010258179 A | 11/2010 |
| JP | 2010258821 A | 11/2010 |
| JP | 2012114663 A | 6/2012 |
| JP | 2013171932 A | 9/2013 |
| JP | 2015018993 A | 1/2015 |
| KR | 20160101592 A | 8/2016 |
| RU | 2399085 C2 | 9/2010 |
| RU | 124005 U1 | 1/2013 |

* cited by examiner

MOBILE TERMINAL AND HEAT DISSIPATION AND SHIELDING STRUCTURE

CROSS-REFERENCE TO RELATED APPLICATION

This application is a continuation of U.S. patent application Ser. No. 15/578,992, filed on Dec. 1, 2017, which is a national stage of International Application No. PCT/CN2015/080737, filed on Jun. 4, 2015. All of the aforementioned patent applications are hereby incorporated by reference in their entireties.

TECHNICAL FIELD

The present disclosure relates to a mobile terminal, and in particular, to a heat dissipation and shielding structure of a mobile terminal.

BACKGROUND

As performance of a mobile terminal is improved constantly, power consumption of the mobile terminal increases constantly; and as integration of a main chip is improved, chip power consumption is high and concentrated. Consequently, an increased chip height becomes a bottleneck limiting design of an overall thickness of the mobile terminal. Therefore, a shielding structure is required in the mobile terminal to perform electromagnetic shielding on the main chip.

In a conventional shielding structure, a shielding can covers a main chip on a circuit board, and the circuit board and the shielding can are then mounted in a middle frame of a mobile terminal. A top of the shielding can and the middle frame are disposed in a stacked manner, and a thermally conductive material is disposed between the shielding can and the middle frame, so that heat emitted by the main chip is transferred. Such a stacked structure is bad for reduction of the mobile terminal thickness, and goes against a lightening and thinning development trend of the mobile terminal.

SUMMARY

Embodiments of the present disclosure provide a mobile terminal and a heat dissipation and shielding structure, so as to achieve design that helps reduce the thickness of a mobile terminal and a heat dissipation and shielding structure, and makes them lighter and thinner.

According to a first aspect, the present disclosure provides a mobile terminal, including a circuit board, a heat emitting element disposed on the circuit board, a shielding can, and a middle frame, where the shielding can is connected to the circuit board, and forms a shielding space together with the circuit board; the heat emitting element is accommodated in the shielding space; the circuit board is disposed on one side of the middle frame; the middle frame is provided with an accommodating space; and the shielding can includes a top and a bottom that are disposed opposite to each other, where the bottom is configured to be connected to the circuit board, and the top is located above the heat emitting element and extends to the accommodating space.

With reference to the first aspect, in a first possible implementation manner, a material of the middle frame is a thermally conductive material, and the middle frame is in direct or indirect contact with the top of the shielding can, so that heat emitted by the heat emitting element can be conducted though the shielding can and the middle frame.

With reference to the first possible implementation manner of the first aspect, in a second possible implementation manner, the middle frame includes a first surface and a second surface, where the first surface faces the shielding can, the second surface and the first surface are disposed in a back to back manner, and a groove is provided on the second surface; and the mobile terminal further includes a highly thermal-conductive body, where the highly thermal-conductive body is disposed in the groove, and the highly thermal-conductive body is laminated to the middle frame.

With reference to the second possible implementation manner of the first aspect, in a third possible implementation manner, the accommodating space is of a through-hole structure; the top includes a top surface; the middle frame includes a lamination surface, and the lamination surface is located on a bottom wall of the groove, and is adjacent to the accommodating space; the highly thermal-conductive body includes a first area and a second area, where the first area is laminated to the top surface, and the second area is laminated to the lamination surface.

With reference to the third possible implementation manner of the first aspect, in a fourth possible implementation manner, the lamination surface is coplanar with the top surface of the shielding can.

With reference to the third possible implementation manner of the first aspect, in a fifth possible implementation manner, the highly thermal-conductive body is a graphite sheet or a copper foil.

With reference to the third possible implementation manner of the first aspect, in a sixth possible implementation manner, the mobile terminal further includes a thermally conductive adhesive, and the thermally conductive adhesive is disposed between the heat emitting element and the top of the shielding can.

With reference to the third possible implementation manner of the first aspect, in a seventh possible implementation manner, the shielding can further includes a first side wall, a second side wall, and a shoulder connected between the first side wall and the second side wall, where the first side wall is connected between the bottom and the shoulder, and the second side wall is connected between the shoulder and the top, and the top forms a convex structure relative to the shoulder.

According to another aspect, the present disclosure provides a heat dissipation and shielding structure, where the heat dissipation and shielding structure includes a shielding can and a heat dissipation board; the shielding can is configured to be connected to the circuit board and form a shielding space together with the circuit board; a heat emitting element is disposed in the shielding space; the shielding can includes a top and a bottom that are disposed opposite to each other, where the bottom is configured to be connected to the circuit board, and the top is located above the heat emitting element; the heat dissipation board is provided with an accommodating space, and the top of the shielding can extends into the accommodating space.

With reference to the second aspect, in a first possible implementation manner, the heat dissipation board includes a first surface and a second surface, where the first surface faces the shielding can, the second surface and the first surface are disposed in a back to back manner, and a groove is provided on the second surface; and the heat dissipation and shielding structure further includes a highly thermal-conductive body, where the highly thermal-conductive body is disposed in the groove, and the highly thermal-conductive body is laminated to the heat dissipation board.

With reference to the first possible implementation manner of the second aspect, in a second possible implementation manner, the accommodating space is of a through-hole structure; the top includes a top surface; the middle frame includes a lamination surface, and the lamination surface is located on a bottom wall of the groove, and is adjacent to the accommodating space; the highly thermal-conductive body includes a first area and a second area, where the first area is laminated to the top surface, and the second area is laminated to the lamination surface.

With reference to the second possible implementation manner of the second aspect, in a third possible implementation manner, the lamination surface is coplanar with the top surface of the shielding can.

With reference to the third possible implementation manner of the second aspect, in a fourth possible implementation manner, the highly thermal-conductive body is a graphite sheet or a copper foil.

With reference to the fourth possible implementation manner of the second aspect, in a fifth possible implementation manner, a material of the heat dissipation board is a metallic material with high thermal conductivity.

With reference to the fourth possible implementation manner of the second aspect, in a sixth possible implementation manner, the heat dissipation and shielding structure further includes a thermally conductive adhesive, and the thermally conductive adhesive is disposed between the heat emitting element and the top of the shielding can.

With reference to the fourth possible implementation manner of the second aspect, in a seventh possible implementation manner, the shielding can further includes a first side wall, a second side wall, and a shoulder connected between the first side wall and the second side wall, where the first side wall is connected between the bottom and the shoulder, the second side wall is connected between the shoulder and the top, and the top forms a convex structure relative to the shoulder.

Compared with the prior art, in the mobile terminal and the heat dissipation and shielding structure that are provided in the present disclosure, the middle frame and the heat dissipation board are each provided with an accommodating space, and the top of the shielding can extends into the accommodating space; this helps reduce thicknesses of the mobile terminal and the heat dissipation and shielding structure, and helps a lightening and thinning development.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show some embodiments of the present disclosure, and a person of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. The described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

The present disclosure provides a mobile terminal and a heat dissipation and shielding structure. FIG. 1 to FIG. 5 may all be used to help describe a structure of the mobile terminal and the heat dissipation and shielding structure. A heat dissipation board in the heat dissipation and shielding structure may be a middle frame in the mobile terminal or a part of the middle frame. In descriptions of a first embodiment (that is, the mobile terminal), referring to FIG. 1 to FIG. 5, the middle frame is expressed using a reference numeral 102. In descriptions of a second embodiment (that is, the heat dissipation and shielding structure), also referring to FIG. 1 to FIG. 5, the heat dissipation board is also expressed using the reference numeral 102. In this way, the reference numeral of the heat dissipation board and that of the middle frame are both 102. However, in the following descriptions of the embodiments, expressions of "middle frame" and "heat dissipation board" are respectively used, to distinguish between the two embodiments. Detailed descriptions are as follows.

Figure 1:
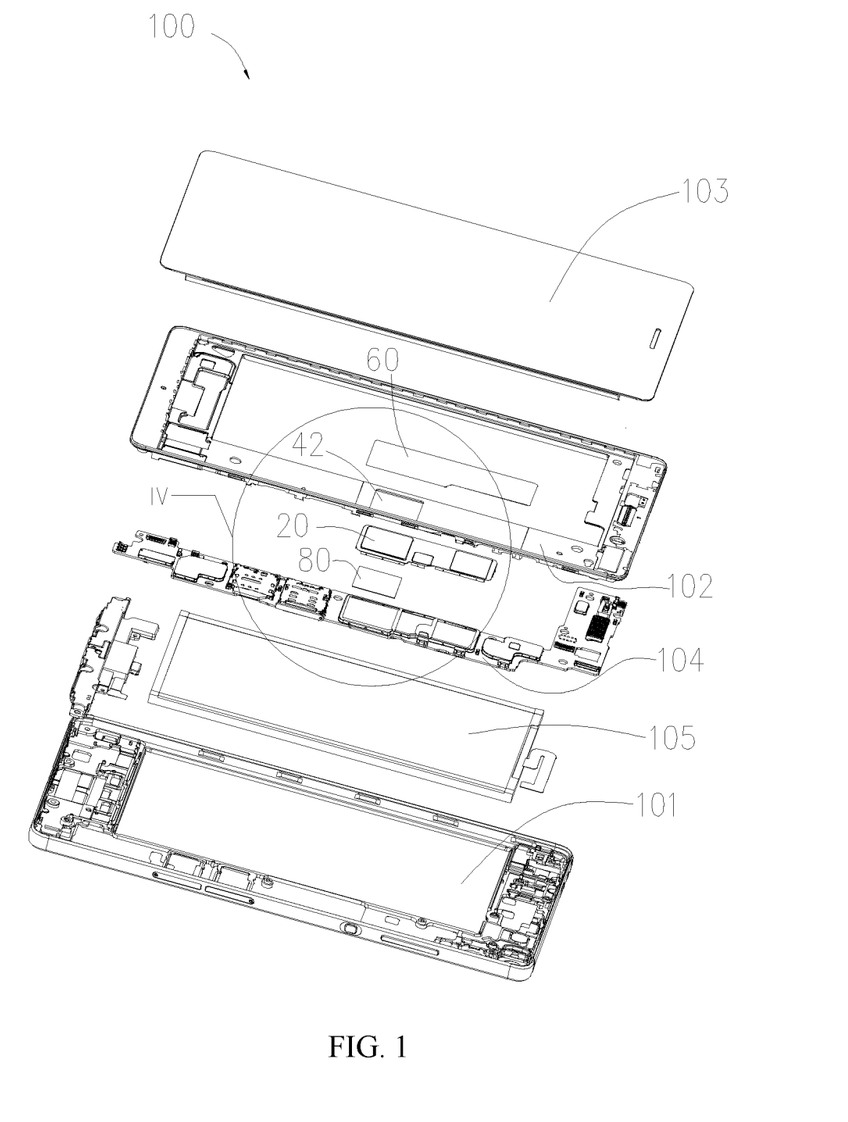
FIG. 1 is a schematic exploded view of a mobile terminal according to an implementation manner of the present disclosure.
Figure 2:
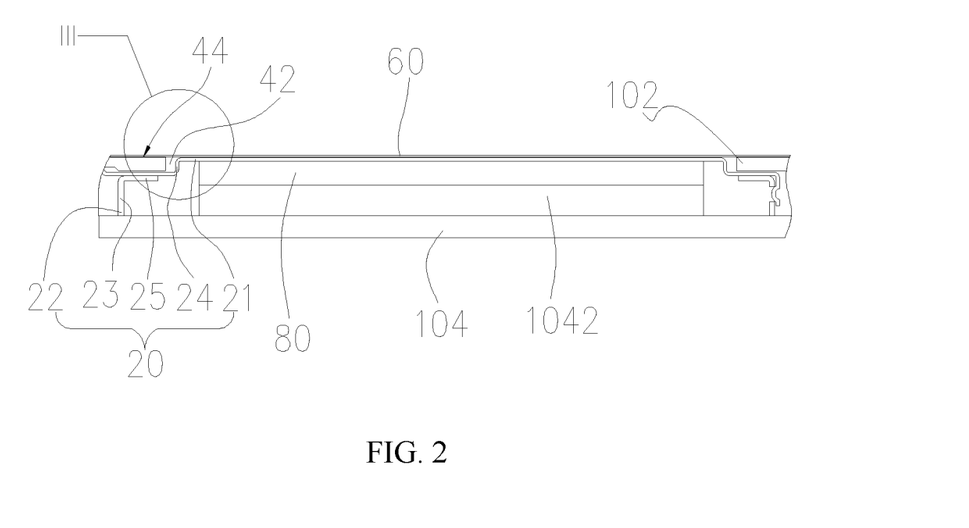
FIG. 2 is a schematic view of a partial cross section of a mobile terminal according to the present disclosure.

An implementation manner of the present disclosure provides a mobile terminal, and the mobile terminal may be a mobile phone or a tablet. Referring to FIG. 1 and FIG. 2, the mobile terminal 100 includes a rear housing 101, a middle frame 102, a screen 103, a circuit board 104, and a battery 105. The circuit board 104 and the battery 105 are mounted on one side of the middle frame 102, and the screen 103 is mounted on the other side of the middle frame 102. The circuit board 104 and the battery 105 are accommodated in the rear housing 101. A heat emitting element 1042 is disposed on the circuit board 104 (as shown in FIG. 2). For example, the heat emitting element 1042 may be a main chip of the mobile terminal 100. The main chip includes a central processing unit (CPU) and a double data rate (DDR) stacked above the CPU. The heat emitting element 1042 may also be another chip (for example: a power management chip, a storage chip, or a radio frequency chip). Because the main chip integrates multiple functions, the main chip is thicker than other chips.

The mobile terminal 100 further includes a shielding can 20. The shielding can 20 is connected to the circuit board 104, and forms a shielding space together with the circuit board 104. The heat emitting element 1042 is accommodated in the shielding space. The middle frame 102 is provided with an accommodating space 42. The shielding can 20 includes a top 21 and a bottom 22 disposed opposite to each other. The bottom 22 is configured to be connected to the circuit board 104, and the top 21 is located above the heat emitting element 1042 and extends into the accommodating space 42.

It should be noted that a maximum depth by which the top 21 extends into the accommodating space 42 is equal to a depth of the accommodating space 42.

In the present disclosure, the top 21 of the shielding can 20 of the mobile terminal 100 extends into the accommodating space 42 of the middle frame 102, that is, the accommodating space 42 is dug on the middle frame 102, and the top 21 of the shielding can 20 is accommodated in the accommodating space 42 during mounting. With such a structure, the mobile terminal 100 may develop to be lighter and thinner, so that both the thickness and weight may be reduced.

A material of the middle frame 102 is a thermally conductive material. The middle frame 102 is in direct or indirect contact with the top 21 of the shielding can 20, so that heat emitted by the heat emitting element can be conducted through the shielding can 20 and the middle frame 102. This is beneficial to heat dissipation of the heat emitting element. The shielding can 20 may be in direct contact with the middle frame 102, so that heat from the shielding can 20 is directly transferred to the middle frame. Alternatively, the shielding can 20 may be in contact with the middle frame 102 using another thermally conductive medium, to improve thermal conducting efficiency. For example, the shielding can 20 may be in indirect contact with the middle frame 102 using a thermally conductive adhesive or another thermal conductor.

Figure 3:
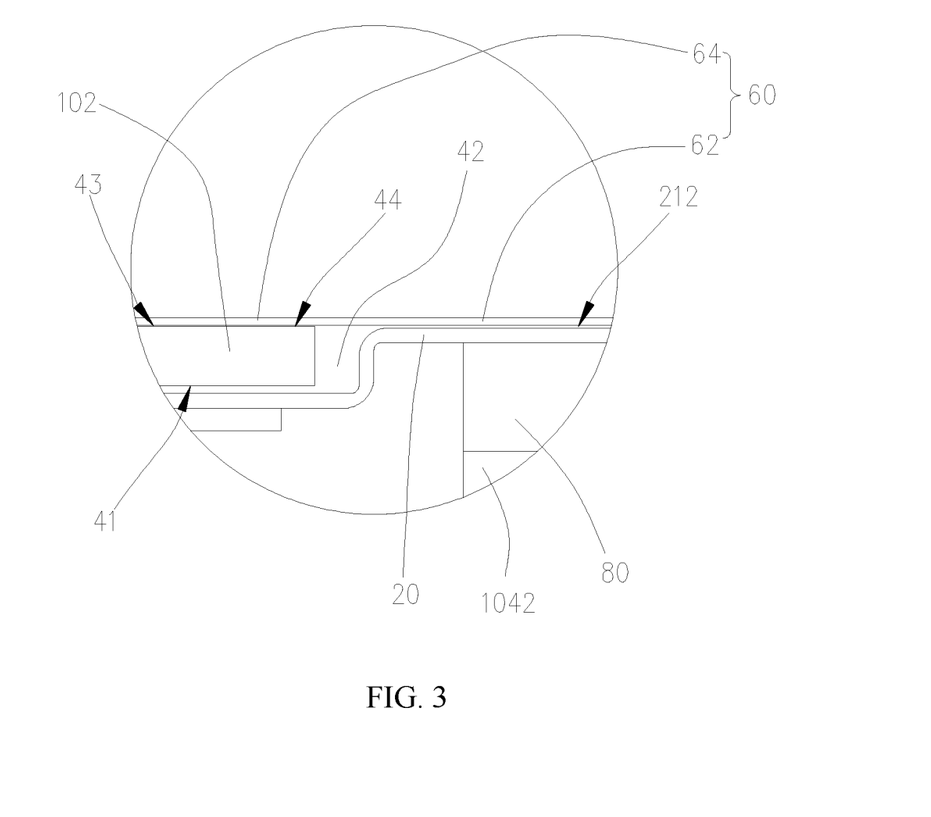
FIG. 3 is an enlarged schematic view of a part III shown in FIG. 2.
Figure 4:
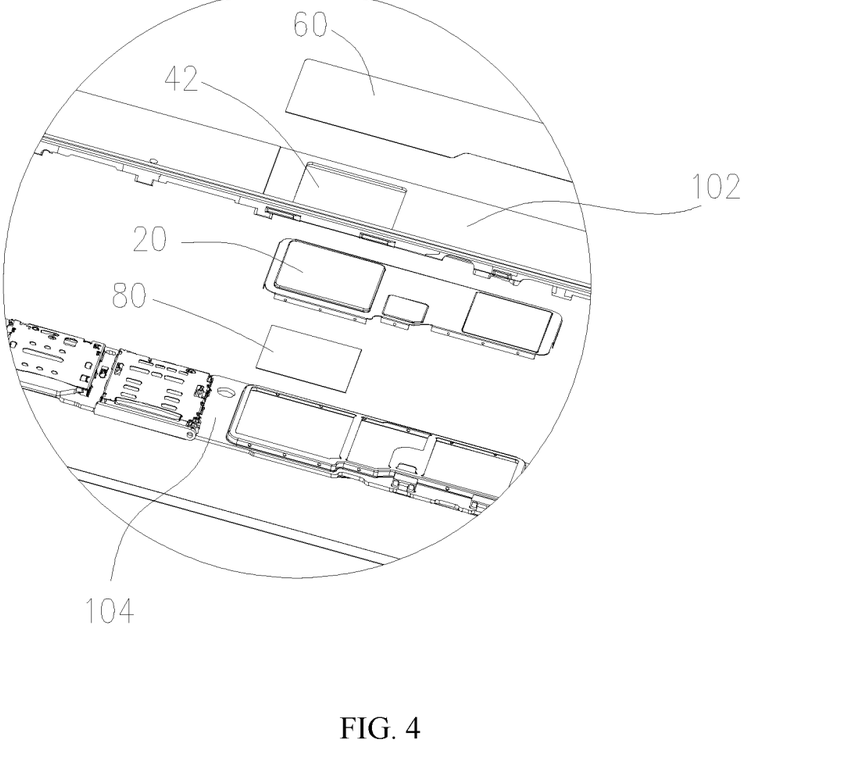
FIG. 4 is an enlarged schematic view of a part IV shown in FIG. 1.

Referring to FIG. 3, the middle frame 102 includes a first surface 41 and a second surface 43. The first surface 41 faces the shielding can. The second surface 43 and the first surface 41 are disposed in a back to back manner. The second surface 43 is provided with a groove (not shown in the figure), that is, the middle frame 102 is provided with a groove. The groove is formed on the second surface 43, that is, the groove is dug on the second surface 43. The mobile terminal 100 further includes a highly thermal-conductive body 60. The highly thermal-conductive body 60 is disposed in the groove, and the highly thermal-conductive body 60 is laminated to the middle frame 102. Using such a structure is equivalent to embedding the highly thermal-conductive body 60 into the middle frame 102, and therefore, a better heat dissipation effect can be achieved.

In an implementation manner, the highly thermal-conductive body 60 is a graphite sheet or a copper foil.

In an implementation manner, referring to FIG. 2 and FIG. 3, the accommodating space 42 is of a through-hole structure. The top 21 includes a top surface 212. The middle frame 102 includes a lamination surface 44. The highly thermal-conductive body 60 includes a first area 62 and a second area 64. The first area 62 is laminated to the top surface 212, and the second area 64 is laminated to the lamination surface 44. The accommodating space 42 is located on a bottom wall of the groove of the second surface and is in communication with the groove. The lamination surface 44 is located on the bottom wall of the groove and is adjacent to the accommodating space 42.

Further, the lamination surface 44 is coplanar with the top surface 212 of the shielding can. The highly thermal-conductive body 60 is mounted in the groove, and a surface of the highly thermal-conductive body 60 is coplanar with a surface of the middle frame 102, so that in a case in which an overall thickness of the mobile terminal does not change, a better heat dissipation effect can be achieved. In addition, the coplanar structure makes the whole middle frame 102 flat, so that a mounting gap can be reduced in an assembly process of the mobile terminal, thereby reducing an overall thickness of the mobile terminal 100.

In an implementation manner, the highly thermal-conductive body 60 has a feature of being bendable. The highly thermal-conductive body 60 passes through the accommodating space 42, so that a part of the highly thermal-conductive body 60 that is on one side of the accommodating space 42 is laminated to the top surface 212 of the shielding can 20, and a part of the highly thermal-conductive body 60 that is on the other side of the accommodating space 42 is laminated to a surface that is of the middle frame 102 and that faces the circuit board 104. That is, the highly thermal-conductive body 60 passes through the accommodating space 42 (the accommodating space 42 is of a through-hole structure), so that a part of the highly thermal-conductive body is located on one side of the middle frame 102, and a part of the highly thermal-conductive body is located on the other side of the middle frame 102.

In another implementation manner, the accommodating space 42 may be of a blind-hole (or groove) structure, that is, a part of the middle frame 102 is reserved, to form a bottom wall in the accommodating space 42, and the bottom wall is in contact with the top 21 of the shielding can 20.

It should be noted that when the mobile terminal uses one shielding can 20 to cover one or more heat emitting elements 1042 on the circuit board 104, one accommodating space 42 may be designed on the middle frame 102 (a height of the shielding can is related to a maximum height of the covered heat emitting elements), and a size of the accommodating space 42 matches that of the top 21 of the shielding can 20. When the mobile terminal uses multiple shielding cans 20 to cover multiple heat emitting elements on the circuit board 104, multiple accommodating spaces 42 with different depths may be designed on the middle frame 102 according to the shielding cans 20 with different heights (the heights of the shielding cans are related to a maximum height of the covered heat emitting elements), and sizes of the multiple accommodating spaces 42 match those of the multiple shielding cans 20. In this way, the middle frame, the shielding cans, and the circuit board can be well buckled together when the assembly of the mobile terminal is completed.

Referring to FIG. 2 and FIG. 3, the mobile terminal 100 further includes a thermally conductive adhesive 80, and the thermally conductive adhesive 80 is disposed between the heat emitting element 1042 and the top 21 of the shielding can 20.

Referring to FIG. 2, the shielding can 20 further includes a first side wall 23, a second side wall 24, and a shoulder 25. The first side wall 23 is connected between the bottom 22 and the shoulder 25, and the second side wall 24 is connected between the shoulder 25 and the top 21. The shielding can 20 forms a convex structure. Such a convex structure of the shielding can 20 enables the shielding can 20 to shield chips with different heights.

Figure 5:
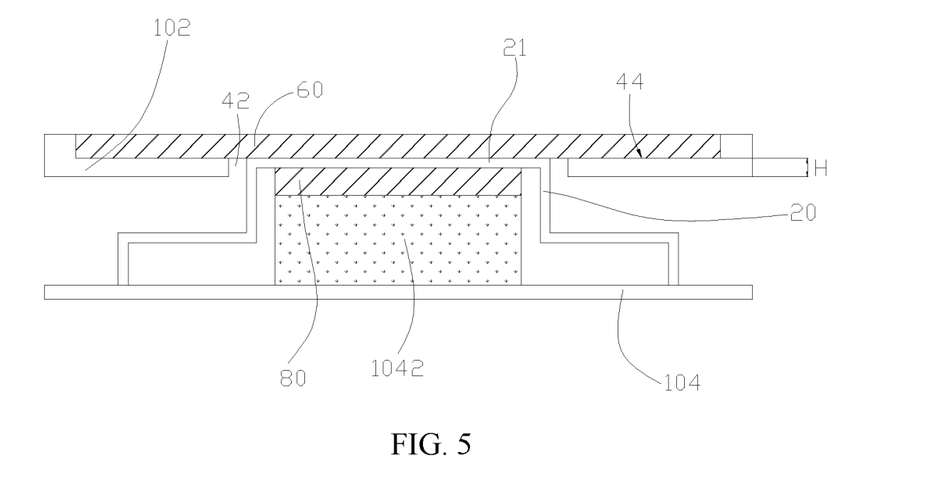
FIG. 5 is schematic plan view of a mobile terminal according to an implementation manner of the present disclosure.

Referring to FIG. 5, FIG. 5 is a schematic plan view of a mobile terminal according to an implementation manner of the present disclosure (only parts related to the shielding can 20 and the middle frame 102 are shown). In FIG. 5, the top 21 of the shielding can 20 extends into the accommodating space 42 of the middle frame 102. The highly thermal-conductive body 60 is accommodated in the groove of the middle frame 102, and the highly thermal-conductive body 60 and the middle frame 102 form an integrated part having a flat surface. The top 21 of the shielding can 20 extends into the accommodating space 42, so that the shielding can 20 and the middle frame 102 have an overlapping area in a thickness direction, and the overlapping area is a size H by which the top 21 of the shielding can 20 extends into the accommodating space 42 in the thickness direction, that is, a height H of the accommodating space 42. In this way, an overall thickness of the mobile terminal can be reduced, and this facilitates a lightning and thinning development of the mobile terminal.

The present disclosure further provides a heat dissipation and shielding structure. The heat dissipation and shielding structure may be applied in the mobile terminal 100, or the heat dissipation and shielding structure may be applied in other electronic products, for example, consumer electronics or machine room electronics such as a set-top box or a router. The heat dissipation and shielding structure provided in the present disclosure may be used in any electronic product having a chip that requires electromagnetic shielding. The following descriptions of the heat dissipation and shielding structure also correspond to FIG. 1 to FIG. 5, but the middle frame 102 in the mobile terminal is renamed heat dissipation board 102. In the heat dissipation and shielding structure, the name "heat dissipation board" is more appropriate, because the heat dissipation board may exist independently of the middle frame, or may be a part of the middle frame. In the mobile terminal, the middle frame may also be regarded as a heat dissipation board, and although the names are different, their meanings are not contradictory.

Referring to FIG. 1 to FIG. 4, the heat dissipation and shielding structure includes a shielding can 20, a heat dissipation board 102, and a highly thermal-conductive body 60.

Referring to FIG. 1 and FIG. 2, the shielding can 20 is configured to be connected to the circuit board 104 and form a shielding space together with the circuit board 104. The heat emitting element 1042 on the circuit board 104 is accommodated in the shielding space. The shielding can 20 includes a top 21 and a bottom 22 disposed opposite to each other. The bottom 22 is connected to the circuit board 104, and the top 21 is located above the heat emitting element 1042. The bottom 22 of the shielding can 20 may be fastened to the circuit board 104 by means of welding, or may be fastened by means of buckling. For example, a buckle is disposed at the bottom 22 of the shielding can 20, and a buckling hole is provided on the circuit board 104. By means of fitting between the buckle and the buckling hole, the shielding can 20 can be fastened on the circuit board 104.

In this implementation manner, when the heat dissipation and shielding structure is applied in the mobile terminal 100, the entire heat dissipation board 102 is integrally formed in the middle frame 102 of the mobile terminal 100, that is, the heat dissipation board 102 is a part of the middle frame 102. In another implementation manner, the heat dissipation board 102 may be separate from the middle frame 102, and the heat dissipation board 102 is fastened to the middle frame 102 by means of adhesion or screw locking. Overall heat dissipation performance can be improved by selecting different materials for the heat dissipation board 102 and the middle frame 102, so that a high thermally conductive material with a relatively high cost but good heat dissipation performance may be selected for the heat dissipation board 102, and an ordinary metallic material may be selected for the middle frame 102. Because the heat dissipation board 102 is close to the heat emitting element 1042, heat from the heat emitting element 1042 may be quickly transferred to the middle frame 102 by relying on the high thermal conducting performance of the heat dissipation board, and then the heat is dissipated through the middle frame 102.

Referring to FIG. 2 and FIG. 3, the heat dissipation board 102 is provided with an accommodating space 42. The top 21 of the shielding can 20 extends into the accommodating space 42, and the top 21 includes a top surface 212. The top surface is disposed on a side, which is away from the heat emitting element 1042, of the top 21 of the shielding can 20, that is, the top surface is a part of an outer surface of the shielding can 20. The heat dissipation board 102 includes a lamination surface 44. The highly thermal-conductive body 60 includes a first area 62 and a second area 64. The first area 62 is laminated to the top surface 212 of the shielding can 20, and the second area 64 is laminated to the lamination surface 44. In this way, the shielding can 20 is connected to the heat dissipation board 102 using the highly thermal-conductive body 60, the highly thermal-conductive body 60 being a graphite sheet or a copper foil, and the highly thermal-conductive body 60 is connected to the shielding can 20 and the heat dissipation board 102 using a thermally conductive adhesive 80. In this implementation manner, the heat dissipation board 102 is board-like, and the highly thermal-conductive body 60 is sheet-like.

In the heat dissipation and shielding structure provided in the present disclosure, the heat dissipation board 102 is provided with the accommodating space 42, and the top 21 of the shielding can 20 extends into the accommodating space 42; this helps reduce a size of the heat dissipation and shielding structure, and facilitates a lightening and thinning development of the mobile terminal 100.

In an implementation manner, referring to FIG. 3, the heat dissipation board 102 includes a first surface 41 and a second surface 43. The first surface 41 faces the shielding can 20. The second surface 43 and the first surface 41 are disposed in a back to back manner. The heat dissipation board 102 is provided with a groove (not shown in the figure), and the groove is formed on the second surface 43, that is, the groove is dug on the second surface 43. The lamination surface 44 is located on a bottom wall of the groove. The highly thermal-conductive body 60 is accommodated in the groove, so that the highly thermal-conductive body 60 is flush with the heat dissipation board 102 after the highly thermal-conductive body 60 is combined with the heat dissipation board 102, that is, a size of the highly thermal-conductive body 60 matches that of the groove on the heat dissipation board 102.

In an implementation manner, the accommodating space 42 is of a through-hole structure, and the accommodating space 42 is in communication with the groove. In a specific manufacturing process, the through hole is punched at a position on the bottom wall of the groove, to form the accommodating space 42. The highly thermal-conductive body 60 is a connection piece between the shielding can 20 and the heat dissipation board 102, that is, the shielding can 20 and the heat dissipation board 102 are in indirect contact using the highly thermal-conductive body 60. The highly thermal-conductive body 60 is configured to conduct heat between the shielding can 20 and the heat dissipation board 102.

In another implementation manner, the accommodating space 42 may be designed to be a blind-hole structure or groove structure. In this case, the heat dissipation board 102 may be in direct contact with the shielding can 20 without using the highly thermal-conductive body 60. Alternatively, the highly thermal-conductive body 60 may be attached to a surface of the heat dissipation board 102, so that the highly thermal-conductive body 60 and the shielding can 20 are respectively located on two sides of the heat dissipation board 102.

In an implementation manner, the highly thermal-conductive body 60 has a feature of being bendable. The highly thermal-conductive body 60 passes through the accommodating space 42, so that a part of the highly thermal-conductive body 60 that is on one side of the accommodating space 42 is laminated to the top surface 212 of the shielding can 20, and a part of the highly thermal-conductive body 60 that is on the other side of the accommodating space 42 is laminated to a surface that is of the heat dissipation board 102 and that faces the circuit board 104. That is, the highly thermal-conductive body 60 passes through the accommodating space 42 (the accommodating space 42 is of a through-hole structure), so that a part of the highly thermal-conductive body is located on one side of the heat dissipation board 102, and a part of the highly thermal-conductive body is located on the other side of the heat dissipation board.

The highly thermal-conductive body 60 is laminated to the top 21 of the shielding can 20 and the lamination surface 44 of the heat dissipation board 102, so that the heat emitted by the heat emitting element 1042 on the circuit board 104 is conducted to the heat dissipation board 102, and the heat dissipation and shielding structure has good heat dissipation performance.

To enhance the heat dissipation performance of the heat dissipation and shielding structure, a metallic material with high thermal conductivity may be selected as a material of the heat dissipation board 102.

The heat dissipation and shielding structure in this embodiment of the present disclosure further includes a thermally conductive adhesive 80. The thermally conductive adhesive 80 is disposed between the heat emitting element 1042 and the top 21 of the shielding can 20, and the thermally conductive adhesive 80 is configured to transfer the heat emitted by the heat emitting element 1042 to the shielding can 20. The shielding can 20 may be made of a metallic conductive material, to improve the heat dissipation capability.

Referring to FIG. 2, the shielding can 20 further includes a first side wall 23, a second side wall 24, and a shoulder 25 connected between the first side wall 23 and the second side wall 24. The first side wall 23 is connected between the bottom 22 and the shoulder 25, and the second side wall 24 is connected between the shoulder 25 and the top 21. The top 21 forms a convex structure relative to the shoulder 25. Such a convex structure of the shielding can 20 enables the shielding can 20 to shield chips with different heights.

It should be noted that when one shielding can 20 is used to cover one or more heat emitting elements 1042 on the circuit board 104, one accommodating space 42 may be designed on the heat dissipation board 102 (a height of the shielding can is related to a maximum height of the covered heat emitting elements), and a size of the accommodating space 42 matches that of the top 21 of the shielding can 20. When multiple shielding cans 20 are used to cover multiple heat emitting elements 1042 on the circuit board 104, multiple accommodating spaces 42 with different depths may be designed on the heat dissipation board 102 according to shielding cans 20 with different heights (the heights of the shielding cans are related to a maximum height of the covered heat emitting elements), and sizes of the multiple accommodating spaces 42 match those of the tops 21 of the multiple shielding cans 20. In this way, the heat dissipation board 102, the shielding cans 20, and the circuit board 102 can be well buckled together.

The heat dissipation and shielding structure may be directly applied in a mobile terminal. When the heat dissipation and shielding structure is applied in the mobile terminal, the heat dissipation board is a part of the middle frame, that is, the middle frame is directly used as the heat dissipation board, to dissipate heat for a heat emitting chip. In this way, functions of the middle frame are increased, that is, a heat dissipation function is added on the basis of an original mounting positioning function; in addition, a thickness of the mobile terminal is reduced. Referring to FIG. 5, FIG. 5 is a schematic plan view of a heat dissipation and shielding structure according to an implementation manner of the present disclosure. In FIG. 5, the top 21 of the shielding can 20 extends into the accommodating space 42 of the heat dissipation board 102. The highly thermal-conductive body 60 is accommodated in the groove of the heat dissipation board 42, and the highly thermal-conductive body 60 and the heat dissipation board 102 form an integrated part having a flat surface. The top 21 of the shielding can 20 extends into the accommodating space 42, so that the shielding can 20 and the heat dissipation board 102 have an overlapping area in a thickness direction, and the overlapping area is a size H by which the top 21 of the shielding can 20 extends into the accommodating space 42 in the thickness direction, that is, a height H of the accommodating space 42. In this way, an overall thickness of the heat dissipation and shielding structure can be reduced, and this facilitates a lightning and thinning development of the mobile terminal.

The foregoing describes in detail a heat dissipation and shielding structure and a mobile terminal that are provided in the embodiments of the present disclosure, and the principles and implementation manners of the present disclosure are described in the specification using specific examples. The foregoing descriptions of the embodiments are merely for helping understand the method and core idea of the present disclosure. Modifications of specific implementation manners and application scopes thereof may be made by a person of ordinary skill in the art according to the idea of the present disclosure. Based on the above, the content of the specification should not be constructed as a limit to the present disclosure.

What is claimed is:
1. A electronic device, comprising:
   a heat dissipation board comprising an accommodating space and a first surface, wherein the accommodating space comprises a through-hole structure;
   a circuit board disposed to one side of the heat dissipation board;
   a screen disposed to another side of the heat dissipation board;
   a heat emitting element disposed on the circuit board, wherein the heat emitting element is accommodated in a shielding space;
   a shielding can comprising a top part and a bottom part that are disposed opposite to each other, wherein the shielding can is coupled to the circuit board and forms the shielding space together with the circuit board, wherein the bottom part of the shielding can is configured to be coupled to the circuit board, and wherein the top part of the shielding can is located above the heat emitting element and extends into the accommodating space of the heat dissipation board; and
   a thermal-conductive body comprising a first area and a second area, wherein the first area is in contact with a top surface of the top part, and wherein the second area is in contact with the first surface of the heat dissipation board.
2. The electronic device of claim 1, wherein the heat dissipation board comprises a thermally conductive material, and wherein the heat dissipation board is in direct or indirect contact with the top surface of the shielding can such that heat emitted by the heat emitting element is configured to be conducted through the shielding can and the heat dissipation board.

3. The electronic device of claim 1, wherein the electronic device further comprises a thermally conductive adhesive, and wherein the thermally conductive adhesive is disposed between the heat emitting element and the top part of the shielding can.

4. The electronic device of claim 1, wherein the shielding can further comprises a first side wall, a second side wall, and a shoulder coupled between the first side wall and the second side wall, wherein the first side wall is coupled between the bottom part and the shoulder, wherein the second side wall is coupled between the shoulder and the top part.

5. The electronic device of claim 1, wherein the heat dissipation board is a middle frame.

6. The electronic device of claim 1, wherein the first area is laminated to the top surface of the top part, and wherein the second area is laminated to the first surface of the heat dissipation board.

7. The electronic device of claim 1, wherein the first surface of the heat dissipation board is coplanar with the top surface of the top part of the shielding can.

8. The electronic device of claim 1 wherein the thermal-conductive body is a graphite sheet or a copper foil.

9. The electronic device of claim 1, wherein the first surface of the heat dissipation board is disposed further away from the circuit board than a second surface of the heat dissipation board, the first surface is opposite to the second surface.

10. The electronic device of claim 1, wherein a size of the accommodating space matches that of the top part of the shielding can.

11. The electronic device of claim 1 further comprising multiple shielding cans covering multiple heat emitting elements on the circuit board, and further comprising multiple accommodating spaces, wherein sizes of the multiple accommodating spaces match those of the multiple shielding cans.

12. A heat dissipation and shielding structure, comprising:
a heat dissipation board comprising an accommodating space and a first surface, wherein the accommodating space comprises a through-hole structure;
a shielding can configured to be coupled to a circuit board and form a shielding space together with the circuit board, wherein a heat emitting element is disposed in the shielding space, wherein the shielding can comprises a top part and a bottom part that are disposed opposite to each other, wherein the bottom part is configured to be coupled to the circuit board, wherein the top part is located above the heat emitting element, and wherein the top part of the shielding can extends into the accommodating space of the heat dissipation board; and
a thermal-conductive body comprising a first area and a second area, wherein the first area is in contact with a top surface of the top part, and wherein the second area is in contact with the first surface of the heat dissipation board.

13. The heat dissipation and shielding structure of claim 12, wherein the first surface of the heat dissipation board is coplanar with the top surface of the top part of the shielding can.

14. The heat dissipation and shielding structure of claim 12, wherein the thermal-conductive body is a graphite sheet or a copper foil.

15. The heat dissipation and shielding structure of claim 12, wherein the heat dissipation board comprises a metallic material with high thermal conductivity.

16. The heat dissipation and shielding structure of claim 12, further comprising a thermally conductive adhesive, wherein the thermally conductive adhesive is disposed between the heat emitting element and the top part of the shielding can.

17. The heat dissipation and shielding structure of claim 12, wherein the shielding can further comprises a first side wall, a second side wall, and a shoulder coupled between the first side wall and the second side wall, wherein the first side wall is coupled between the bottom part and the shoulder, wherein the second side wall is coupled between the shoulder and the top part.

18. The heat dissipation and shielding structure of claim 12, wherein the heat dissipation board comprises a thermally conductive material, and wherein the heat dissipation board is in direct or indirect contact with the top part of the shielding can such that heat emitted by the heat emitting element is configured to be conducted through the shielding can and the heat dissipation board.

19. The heat dissipation and shielding structure of claim 12, wherein a size of the accommodating space matches that of the top part of the shielding can.

20. The heat dissipation and shielding structure of claim 12 further comprising multiple shielding cans covering multiple heat emitting elements on the circuit board, and further comprising multiple accommodating spaces, wherein sizes of multiple accommodating spaces match those of the multiple shielding cans.

* * * * *